(12) United States Patent
Yoshida et al.

(10) Patent No.: US 8,217,573 B2
(45) Date of Patent: Jul. 10, 2012

(54) ORGANIC EL ELEMENT HAVING FORWARD TAPERED BANKS CONTAINING FLUORINE RESIN AND MANUFACTURING METHOD THEREOF

(75) Inventors: Hidehiro Yoshida, Osaka (JP); Yoshiro Kitamura, Osaka (JP); Shuhei Nakatani, Osaka (JP); Hisao Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/035,024

(22) Filed: Feb. 25, 2011

(65) Prior Publication Data

US 2011/0140596 A1 Jun. 16, 2011

Related U.S. Application Data

(63) Continuation of application No. 12/507,134, filed on Jul. 22, 2009, now Pat. No. 8,008,860, which is a continuation of application No. 12/305,796, filed as application No. PCT/JP2008/001266 on May 21, 2008, now Pat. No. 7,781,963.

(30) Foreign Application Priority Data

May 31, 2007 (JP) .................................. 2007-145877

(51) Int. Cl.
*H05B 33/00* (2006.01)
*H01J 9/26* (2006.01)
(52) U.S. Cl. ........... 313/506; 313/504; 445/24; 428/690
(58) Field of Classification Search .................. None
See application file for complete search history.

(56) References Cited

U.S. PATENT DOCUMENTS

| | | | |
|---|---|---|---|
| 6,755,983 B2 | 6/2004 | Yudasaka |
| 6,774,392 B2 | 8/2004 | Humbs et al. |
| 6,790,587 B1 | 9/2004 | Feiring et al. |
| 6,851,996 B2 | 2/2005 | Blaessing et al. |
| 6,852,476 B2 | 2/2005 | Shiraki et al. |
| 6,887,631 B2 | 5/2005 | Kiguchi et al. |
| 7,063,994 B2 | 6/2006 | Xiao et al. |
| 7,199,516 B2 | 4/2007 | Seo et al. |
| 7,217,495 B2 | 5/2007 | Feiring et al. |
| 7,326,653 B2 | 2/2008 | Gunner et al. |
| 2002/0016031 A1 | 2/2002 | Fujimori et al. |

(Continued)

FOREIGN PATENT DOCUMENTS

JP 2001-286833 10/2001

(Continued)

OTHER PUBLICATIONS

Database WPI Week 200331, Thomson Scientific, London, GB; AN 2003-323493, XP002537505.

(Continued)

*Primary Examiner* — Sikha Roy
(74) *Attorney, Agent, or Firm* — Greenblum & Bernstein, P.L.C.

(57) ABSTRACT

An organic EL element having a functional layer with a uniform film thickness is provided. The organic EL element of the present invention contains a substrate; an anode electrode set on the substrate; an organic EL layer set on the anode electrode; a cathode electrode set on the organic EL layer; and a bank having a forward tapered shape, which define the organic EL layer. The bank contains a fluorine resin, the fluorine concentration at a top of the bank is higher than the fluorine concentration at a bottom surface of the bank, and a height of the top of the bank from the substrate is 0.8 to 1.2 µm.

3 Claims, 8 Drawing Sheets

U.S. PATENT DOCUMENTS

| | | |
|---|---|---|
| 2003/0038595 A1 | 2/2003 | Miyake et al. |
| 2003/0042849 A1 | 3/2003 | Ogino |
| 2003/0211643 A1 | 11/2003 | Fujimori et al. |
| 2004/0119066 A1 | 6/2004 | Han et al. |
| 2004/0131782 A1 | 7/2004 | Hasei et al. |
| 2004/0202819 A1 | 10/2004 | Frost et al. |
| 2005/0170208 A1 | 8/2005 | Yatsunami et al. |
| 2005/0196969 A1 | 9/2005 | Gunner et al. |
| 2006/0147752 A1 | 7/2006 | Lee et al. |
| 2006/0284189 A1 | 12/2006 | Sakata et al. |
| 2007/0023837 A1 | 2/2007 | Lee et al. |
| 2007/0082144 A1 | 4/2007 | Hasei et al. |
| 2007/0200125 A1 | 8/2007 | Ikeda et al. |
| 2008/0012480 A1 | 1/2008 | Yatsunami et al. |

FOREIGN PATENT DOCUMENTS

| | | |
|---|---|---|
| JP | 2002-237383 | 8/2002 |
| JP | 2002-543469 | 12/2002 |
| JP | 2003-068457 | 3/2003 |
| JP | 2003-082042 | 3/2003 |
| JP | 2003-086372 | 3/2003 |
| JP | 2005-052835 | 3/2005 |
| JP | 2005-522000 | 7/2005 |
| JP | 2005-235569 | 9/2005 |
| JP | 2006-114477 | 4/2006 |
| JP | 2006-171086 | 6/2006 |
| JP | 2007-019489 | 1/2007 |
| JP | 2007-026976 | 2/2007 |
| JP | 2007-036259 | 2/2007 |
| JP | 2007-095606 | 4/2007 |
| WO | 03/083960 | 10/2003 |
| WO | 2007/023272 | 3/2007 |

OTHER PUBLICATIONS

U.S. Office Action dated Feb. 23, 2010 for corresponding U.S. Appl. No. 12/305,796.

ORGANIC EL ELEMENT HAVING FORWARD TAPERED BANKS CONTAINING FLUORINE RESIN AND MANUFACTURING METHOD THEREOF

CROSS-REFERENCE TO RELATED APPLICATION

This application is a continuation of U.S. application Ser. No. 12/507,134, which is a continuation of U.S. application Ser. No. 12/305,796, which is a National Stage of International Application No. PCT/JP2008/001266, filed May 21, 2008, the disclosure of which is expressly incorporated by reference herein in its entirety.

FIELD OF THE INVENTION

The present invention relates to an organic device such as an organic EL (OEL) element, an organic EL display panel and the like and a manufacturing method thereof.

BACKGROUND OF THE INVENTION

An organic device such as an organic semiconductor element, OEL element and the like usually has a functional layer containing an organic functional material set between an anode and a cathode. According to functions of the organic functional material, an organic device can be classified into a semiconductor element (transistor), a light-emitting element, a liquid crystal element and the like. The semiconductor element has an organic semiconducting material connecting a source electrode and a drain electrode set on a substrate surface, for example; and the organic EL element has a light emitting layer containing an organic EL material set between the anode electrode set on the substrate surface and the cathode electrode.

In order to pattern the organic functional material on the electrode, a barrier (that is, a bank) surrounding an electrode is formed, and a composition containing the organic functional material is applied to a region defined by the banks in some cases. A material of the bank may be a resin.

When ink containing the organic functional material is applied to the region including the electrode surface defined by the banks, it is preferable that the region to be coated (including the electrode surface) has high lyophilicity and the upper surface of the bank has low lyophilicity in general. That is to prevent the ink from leaking to the outside of the targeted region.

In general, a fluorine component is known to decrease the energy and the lyophilicity of a substance surface. The method to subject the bank surface to plasma-treatment with a fluorocarbon gas in order to decrease the lyophilicity of an upper surface of the bank, is known (See Patent Document 1). However, if the bank surface is plasma-treated with the fluorocarbon gas, usually, fluorine is not chemically bonded to a surface of the material of a bank but just adsorbed to the material surface by an intermolecular force. Therefore, even if fluorine is adsorbed to the material surface by plasma treatment, fluorine migration may occur by thermal process or the like. If fluorine is migrated to an organic functional layer of an organic device, for example, it deteriorates device property. Particularly, if a fluorine atom with large electron withdrawing is mixed in an organic light emitting layer, there is a fear that a light emitting exciter is deactivated and light emission efficiency or the like is adversely affected.

As means for solving the above problems, forming a bank using a fluorinated photoresist is proposed (See Patent Document 2). The bank formed with a photolithography process which comprises application step of applying fluorinated photoresist; development step; washing step; calcination step and the like has a feature that lyophilicity is low even without plasma treatment.

Patent Document 1: Japanese Patent Laid-Open Publication No. 2005-52835
Patent Document 2: Japanese Patent Application Laid-Open No. 2005-522000

SUMMARY OF THE INVENTION

As mentioned above, since the bank using the fluorinated photoresist has low lyophilicity, it is suitable for banks defining the region to which an organic material is applied. However, lyophilicity on a wall surface of the bank has been low in some cases in the bank using the fluorinated photoresist. Thus, if an organic material is applied so as to form a functional layer in a region defined by banks, the applied organic material is repelled by the wall surface of the bank and a functional layer having a uniform film thickness has not been formed in a desired region in some cases.

The present invention has an object to form a functional layer having a uniform film thickness in a region defined by banks by controlling lyophilicity at a wall surface of the bank when the bank is formed using a fluorine photoresist.

That is, the first aspect of the present invention relates to an organic display panel mentioned below:

[1] An organic EL display panel containing an anode electrode set on a substrate; line-state banks defining a line state region set on the substrate on which the anode electrode is set; a hole transport layers arranged in matrix state on the substrate, the hole transport layer being set in the line-state region; a line-state interlayer set in the line-state region; a line-state organic EL layer set in the line-state region; and a cathode electrode provided on the organic EL layer, in which the bank contains a fluorine resin.

[2] The organic EL display panel described in [1] further comprising an insulating inorganic film, wherein a material of the hole transport layer contains polyethylenedioxythiophene, and the insulating inorganic film protrudes from the line-state bank into the line-state region and is in contact with a bottom surface of the hole transport layer.

[3] The organic EL display panel described in [1] further comprising an insulating inorganic film, wherein a material of the hole transport layer contains tungsten oxide ($WO_x$), molybdenum oxide ($MoO_x$), vanadium oxide ($VO_x$) or a combination of them, and the insulating inorganic film protrudes from the line-state bank into the line-state region and is in contact with a bottom surface of the line-state interlayer.

[4] The organic EL display panel described in [1] or [2], wherein a material of the hole transport layer contains polyethylenedioxythiophene; a second bank defining two or more pixel regions in the line-state region is further provided; the pixel region defines the hole transport layer; the second bank has a groove connecting the pixel regions with each other; and a height of the second bank from the substrate is smaller than the height of the line-state bank from the substrate.

[5] The organic EL display panel described in [1] or [3] further comprising a second bank defining two or more pixel regions in the line-state region, wherein a material of the hole transport layer contains tungsten oxide ($WO_x$), molybdenum oxide ($MoO_x$), vanadium oxide ($VO_x$) or a combination of them; the pixel region defines the interlayer and the organic EL layer; the second bank has a groove connecting the pixel regions with each other; and a height of the second bank from the substrate is smaller than the height of the line-state bank from the substrate.

[6] The organic EL display panel described in any of [1] to [5], wherein a fluorine concentration of the fluorine resin gradually changes along a thickness direction of the bank; and the fluorine concentration at a top of the bank is higher than the fluorine concentration at a bottom surface of the bank.

[7] The organic device described in any of [1] to [6], wherein the fluorine concentration at the top of the bank is 5 to 10 atom % and the fluorine concentration at the bottom surface of the resin bank is 0 to 3 atom %.

[8] The organic EL display panel described in any of [1] to [7], wherein the bank is in a forward tapered shape.

The second aspect of the present invention relates to a manufacturing method of an organic display panel mentioned below:

[9] A manufacturing method of an organic EL display panel including the steps of forming an anode electrode on a substrate; forming line-state banks defining a line-state region and containing a fluorine resin on the substrate so as to expose the anode electrode; forming matrix-state hole transport layers on the substrate; forming a line-state interlayer in the line-state region; applying an ink containing an organic EL material and a solvent to the line-state region with ink-jet, dispenser, nozzle coating, intaglio printing or letterpress printing in a line state to form a line-state organic EL layer in the line-state region; and forming a cathode electrode on the organic EL layer, in which a material of the hole transport layer contains polyethylenedioxythiophene.

[10] A manufacturing method of an organic EL display panel including the steps of forming an anode electrode on a substrate; forming matrix-state hole transport layers on the substrate; forming line-state banks defining a line-state region and containing a fluorine resin on the substrate so as to expose the hole transport layer; forming a line-state interlayer in the line-state region; applying an ink containing an organic EL material and a solvent to the line-state region with ink-jet, dispenser, nozzle coating, intaglio printing or letterpress printing in a line state to form a line-state organic EL layer in the line-state region; and forming a cathode electrode on the organic EL layer, in which a material of the hole transport layer contains tungsten oxide ($WO_x$), molybdenum oxide ($MoO_x$), vanadium oxide ($VO_x$) or a combination of them.

Since the organic device of the present invention has a bank containing a fluorine resin with low lyophilicity of an upper surface, a material of a functional layer applied to a region defined by the banks does not leak to another region. In addition, since the lyophilicity of the wall surface of the bank is higher than that of the upper surface of the bank, a functional layer with uniform thickness is formed. Particularly, by forming the bank containing the fluorine resin provided at the organic device of the present invention in the forward tapered shape, the lyophilicity of the bank gradually changes along the thickness (the larger the thickness is, the lower the lyophilicity becomes), and a uniform functional layer is easily formed.

DETAILED DESCRIPTION OF THE PREFERRED EMBODIMENT

1. Organic EL Element

Figure 1:
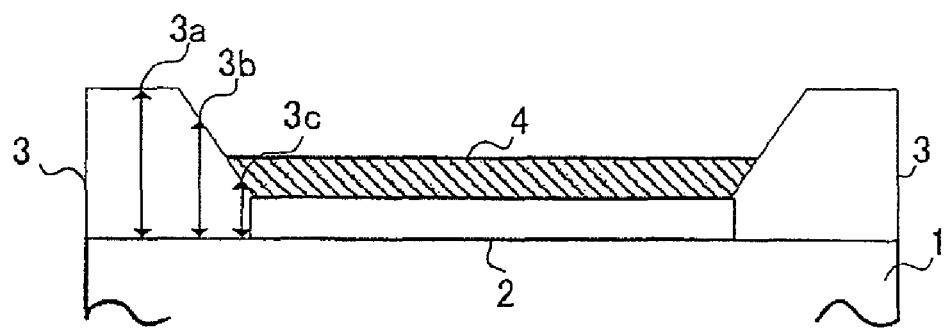
FIG. 1 is a diagram illustrating an organic EL element having a bank in a forward tapered shape.

An organic EL element of the present invention has a substrate, an anode electrode, a cathode electrode, a hole transport layer, an interlayer, an organic EL layer and a bank.

The organic EL element of the present invention may have a thin film transistor (driving TFT) for driving the organic EL element. The anode electrode of the organic EL element and a source or drain electrode of the driving TFT may be connected to each other.

A material of the substrate of the organic EL element of the present invention is different depending on whether the organic EL element is of bottom emission type or of top emission type. In the case where the organic EL element is of bottom emission type, the substrate is required to be transparent, therefore the substrate may be glass, transparent resin or the like. On the other hand, in the case where the organic EL element is of top emission type, there is no need for the substrate to be transparent, and any material can be used as long as the material is an insulant.

On the substrate, an anode electrode is formed. When the organic EL element is of bottom emission type, the anode electrode is required to be a transparent electrode, and it may be made of ITO or the like. When the organic EL element is of top emission type, the anode electrode is required to reflect light, and it may be made of an alloy containing silver or more specifically by a silver-palladium-copper alloy (also referred to as APC), for example.

Over the anode electrode, a hole transport layer or an interlayer is set. Over the anode electrode, both the hole transport layer and the interlayer may be set in this order. There may be a case where the hole transport layer is not formed.

The hole transport layer is a layer made of a hole transport material. Examples of the hole transport material include poly (3, 4-ethylenedioxythiophene) doped with polystyrene sulfonic acid (also referred to as PEDOT-PSS) and its derivative (copolymer or the like). The thickness of the hole transport layer is usually 10 nm or more and 100 nm or less and may be approximately 30 nm.

A material of the hole transport layer may be a metal oxide such as $WO_x$ (tungsten oxide), $MoO_x$ (molybdenum oxide) $VO_x$ (vanadium oxide) or the like or a combination of them.

The interlayer has a role to block the transportation of electrons to the hole transport layer and a role to efficiently transport holes to the organic EL layer. The interlayer is a layer made of a polyaniline material, for example. The thickness of the interlayer is usually 10 nm or more and 100 nm or less and may preferably be approximately 40 nm.

The hole transport layer and the interlayer are set in a region defined by the banks, which will be described later.

On the interlayer, the organic EL layer is set. The organic material contained in the organic EL layer may be a low-molecular material or high-molecular (polymeric) material. In the case of the low-molecular organic EL material, the organic material includes dopant material and a host material. Examples of the dopant material include BCzVBi, coumarin, rubrene, DCJTB and the like, while examples of the host material include DPVBi, Alq3 and the like.

Examples of the polymer organic EL material include poly phenylene vinylene and its derivatives, poly acetylene and its derivatives, poly phenylene and its derivatives, poly para phenylene ethylene and its derivatives, poly 3-hexyl thiophene (P3HT) and its derivatives, poly fluorene (PF) and its derivatives and the like. The organic material contained in the organic EL layer is preferably a polymer organic EL material.

The organic EL layer may be formed in a region defined by the banks, which will be described later.

The organic EL element of the present invention has banks defining region of the interlayer and the organic EL layer as mentioned above. The bank is characterized by containing a fluorine resin. The fluorine resin contained in the bank is not particularly limited and it is only necessary that the resin has a fluorine atom in at least a part of repeating units in its polymer repeating units. Examples of the fluorine resin include fluorinated polyolefin resin, fluorinated polyimide resin, fluorinated polyacrylic resin and the like. More specific examples of the fluorine resin include a fluorine-containing polymer described in Japanese Patent Application Laid-Open No. 2002-543469; LUMIFLON (registered trademark by Asahi Glass Co., Ltd.) which is a copolymer of fluoroethylene and vinylether; and the like. A height of the bank from the substrate is 0.1 to 2 μm and particularly preferably 0.8 to 1.2 μm.

The shape of the bank is preferably a forward tapered shape. The forward tapered shape means a shape in which a wall surface of the bank is slanted and an area of the bottom surface of the bank is larger than an area of the upper surface of the bank (See FIG. 1). When the shape of the bank is a tapered shape, a taper angle is 20 to 80° and particularly preferably 35 to 45°.

The bank in the present invention is characterized by having a low lyophilicity at the upper surface of the bank. The term "upper surface of the bank" means a plane including the top of the bank. The low lyophilicity means that the contact angle of water on at least a part of the upper surface of the bank is 80° or more, or preferably 90° or more. Usually, the contact angle of water at the upper surface of the bank is 110° or less.

Further, the bank in the present invention is characterized by having a high lyophilicity at the bottom surface of the bank. The high lyophilicity means that the contact angle of water on at least a part of the bank bottom surface is 70° or less, or preferably 60° or less.

As mentioned above, the lyophilicity of the bank in the present invention gradually changes along the thickness direction of the bank. The lyophilicity in the bank is mainly determined by a concentration of a fluorine atom. Therefore, the lyophilicity gradient along the thickness direction of the bank is obtained by gradually changing the fluorine concentration of the fluorine resin along the thickness direction of the bank.

As will be described later, the bank of the present invention may be formed by baking (heating) a film made of a fluorine resin-containing composition (bake-treatment) patterned to a desired shape. The present inventors found that the fluorine concentration of the fluorine resin gradually changes along the thickness direction of the bank by making the shape of the bank formed with bake-treatment in the forward tapered shape.

In the present invention, the fluorine atom concentration at the upper surface of the bank is preferably 5 to 10 atom %, while the fluorine concentration at the bottom surface of the bank is preferably 0 to 3 atom %. The fluorine atom concentration is measured by an X-ray photoelectron spectrometer (also referred to as XPS or ESCA).

A mechanism to gradually change the fluorine concentration of the fluorine resin along the thickness direction of the bank will be described below.

Table 1 is a graph illustrating a relation between the thickness of a bank formed by baking (heating) film made of a fluorine resin-containing composition (bake-treatment) and the fluorine concentration at the upper surface of the bank.

TABLE 1

| Film Thickness (μm) | Water Contact Angle | Anisole Contact Angle | Fluorine Concentration (atom %) |
|---|---|---|---|
| 1 | 81.2° | 45.5° | 7.5 |
| 0.9 | 78.9° | 43.0° | 6.9 |
| 0.8 | 76.5° | 40.6° | 6.3 |
| 0.7 | 74.1° | 38.2° | 5.6 |
| 0.6 | 71.7° | 35.7° | 5.0 |
| 0.5 | 69.4° | 33.3° | 4.3 |
| 0.4 | 67.0° | 30.8° | 3.7 |
| 0.3 | 64.6° | 28.4° | 3.0 |
| 0.2 | 62.2° | 25.9° | 2.4 |
| 0.1 | 59.9° | 23.5° | 1.7 |

As shown in Table 1, the thicker the bank becomes, the higher the fluorine concentration on the upper surface of the bank becomes, and both the water contact angle and the anisole contact angle become larger (lyophilicity is decreased).

In addition, when the bank shape is a forward tapered shape as mentioned above, a gradient is generated in the thickness at the bank on its wall surface. That is, as shown in FIG. 1, the bank thickness becomes smaller in the order of 3a, 3b, 3c.

As mentioned above, the concentration of the fluorine component at the upper surface of the thin bank is decreased; and the concentration of the fluorine component at the upper surface of thick bank is increased. Therefore, in bank 3 having the forward tapered shape shown in FIG. 1, the fluorine concentration at a spot shown by 3a (bank thickness is large) is relatively high, and the fluorine concentration at a spot shown by 3c (bank thickness is small) is relatively low. Consequently, the fluorine concentration in bank 3 is decreased in the order of 3a, 3b, 3c. In FIG. 1, reference numeral 1 denotes a substrate and reference numeral 2 denotes an electrode.

As mentioned above, by forming the bank having the forward tapered shape with bake-treatment, the fluorine concentration of the fluorine resin gradually changes along the thickness direction of the bank. In addition, by gradually changing the fluorine concentration of the fluorine resin along the bank thickness direction, a gradient of the lyophilicity along the thickness direction of the bank is obtained. Therefore, upper surface 3a of the bank with low lyophilicity plays a role to suppress the leakage of the material of the functional layer defined by the banks, which is the inherent role of the bank; and since the lyophilicity of lower part 3c of the bank wall surface is high, the functional layer (a hole transport layer, an interlayer or an organic EL layer) is assuredly set over the entire region defined by the banks, that is, up to the edges of the banks.

As mentioned above, by making the shape of the bank made of baked fluorine resin in the forward tapered shape to set the lyophilicity of the bank lower part higher than the lyophilicity of the bank upper part, a functional layer having a uniform thickness is formed in a defined region without leaving an unapplied spot. Further, by adjusting the shape of the forward taper, the shape of the layer to be formed may be controlled. For example, the leakage of the functional layer over the region defined by the banks is prevented by adjusting the taper angle.

Figure 2:
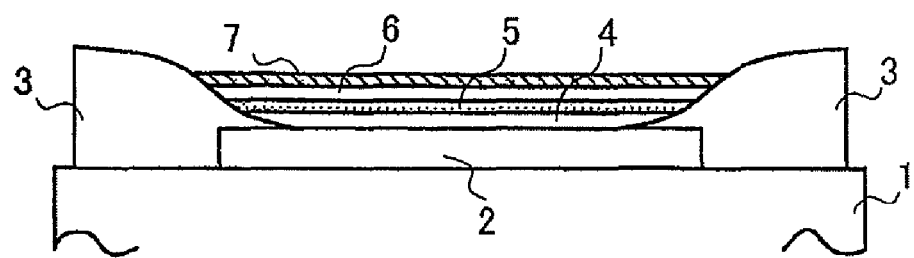
FIG. 2 is a diagram illustrating the organic EL element having a bank in a forward tapered shape which has two inflection points.

Moreover, the bank having the forward tapered shape may have two inflection points (See FIG. 2). By forming bank in the forward tapered shape with the two inflection points, an angle between bank 3 and electrode 2 becomes small. Therefore, the ink containing functional layer material 4 is easily applied to the region defined by the banks, application is made on the whole surface of the defined region without leaving an unapplied spot, and a uniform thin film is obtained. In FIG. 2, reference numeral 1 denotes a substrate and reference numeral 2 denotes an electrode.

The organic EL element of the present invention has a cathode electrode layer on the organic EL layer. A material of the cathode electrode layer is different depending on whether the organic EL element is of top emission type or of bottom emission type. In the case where the organic EL element is of top emission type, the cathode electrode needs to be transparent, and the cathode electrode is preferably an ITO electrode or an IZO electrode or the like. A buffer layer and the like are preferably formed between the organic EL layer and the cathode electrode layer. On the other hand, in the case where the organic EL element is of bottom emission type, there is no need for the cathode electrode to be transparent, and an electrode may be made of any material.

The organic EL element of the present invention may be sealed by further providing a cover material on the cathode electrode. The cover material suppresses the intrusion of moisture and oxygen.

The organic EL element of the present invention may further have an electrically insulating inorganic film (hereinafter referred to as "inorganic insulating film"). It is needless to say that the inorganic insulating film is an electrically insulant. The inorganic insulating film also preferably has high lyophilicity. Examples of a material of the inorganic insulating film include silicon oxide ($SiO_2$), silicon nitride ($Si_3N_4$), silicon oxynitride (SiON) and the like. The thickness of insulating inorganic film is preferably 10 to 200 nm.

Figure 3:
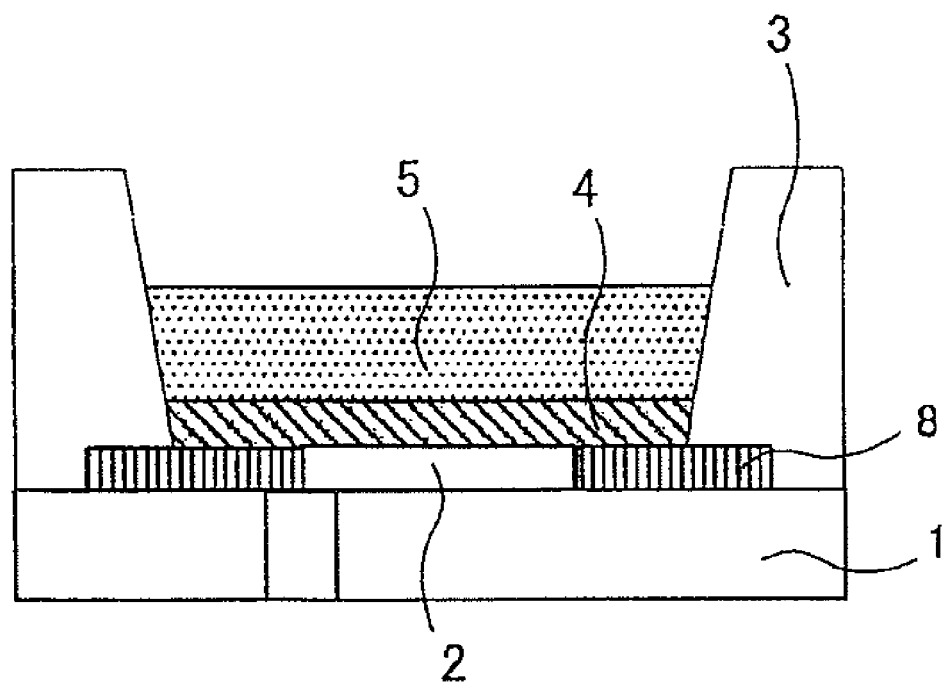
FIG. 3 is a diagram of the organic EL element having an inorganic insulating film.

The inorganic insulating film preferably protrudes from the bank to the region defined by the banks (See FIG. 3). Preferably, the inorganic insulating film protrudes from the bank by 5 to 10 μm.

In the present invention, a solution containing a material of the functional layer (a hole transport layer or an interlayer) is applied on the inorganic insulating layer protruding from the bank. By the inorganic insulating film with high lyophilicity, the solution is uniformly applied on the entire region defined by the banks to obtain the functional layer with a uniform film thickness. As mentioned above, in the present invention, the functional layer with more uniform thickness is obtained by combining the lyophilicity of the bank gradually changing along the thickness direction and the inorganic insulating film.

As mentioned above, the organic EL element of the present invention has the inorganic insulating film (optional) protruding from the bank, and the setting position of the inorganic insulating film may be classified into the following two modes depending on the material of the hole transport layer. The shape and the setting position of the inorganic insulating film will be described below for each of the two modes.

(1) In the Case where a Material of the Hole Transport Layer is PEDOT-PSS (See FIG. 3):

The inorganic insulating film in this case is set on the substrate so as to be in contact with the bottom surface of the hole transport layer (See FIG. 3). By forming the inorganic insulating film so as to be in contact with the bottom surface of the hole transport layer, the film thickness of the hole transport layer made of PEDOT-PSS is made more uniform.

Figure 4A:
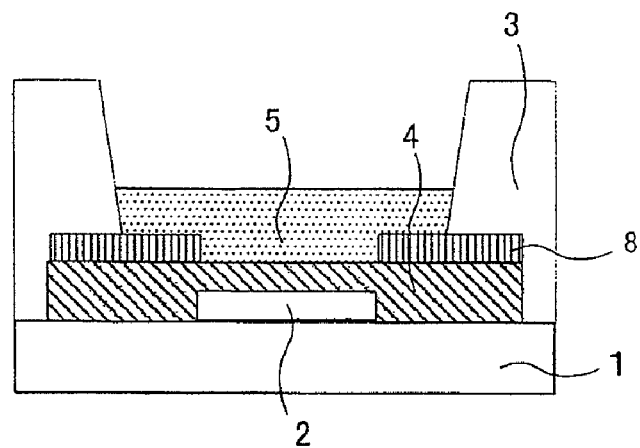
FIG. 4 is a diagram of the organic EL element having an inorganic insulating film.
Figure 4B:
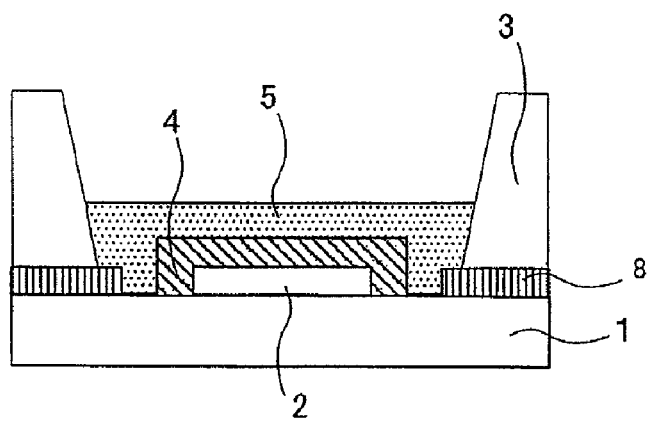
Figure 4C:
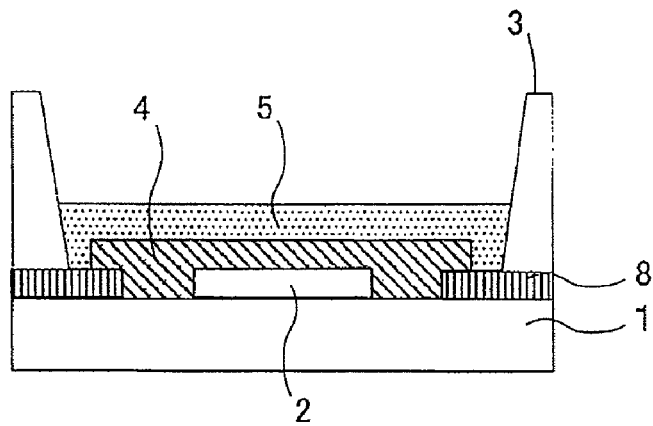

(2) In the Case where a Material of the Hole Transport Layer is a Metal Oxide Such as Tungsten Oxide or the Like (See FIG. 4):

In this case, the inorganic insulating film is formed so as to be in contact with the bottom surface of the interlayer (See FIG. 4). The inorganic insulating film may be set on the hole transport layer (FIG. 4A), on the substrate (FIG. 4B), or on the substrate and below the hole transport layer (FIG. 4C), as long as it is formed so as to be in contact with the bottom surface of the interlayer. By forming the inorganic insulating film so as to be in contact with the bottom surface of the interlayer, the film thickness of the interlayer formed by applying the solution containing the material of the interlayer to the region defined by the banks is made more uniform. In addition, by setting the inorganic insulating film between the bank and the hole transport layer (FIG. 4A), adhesion between the bank and the hole transport layer made of a metal oxide is improved.

2. Organic EL Display Panel

Figure 5:
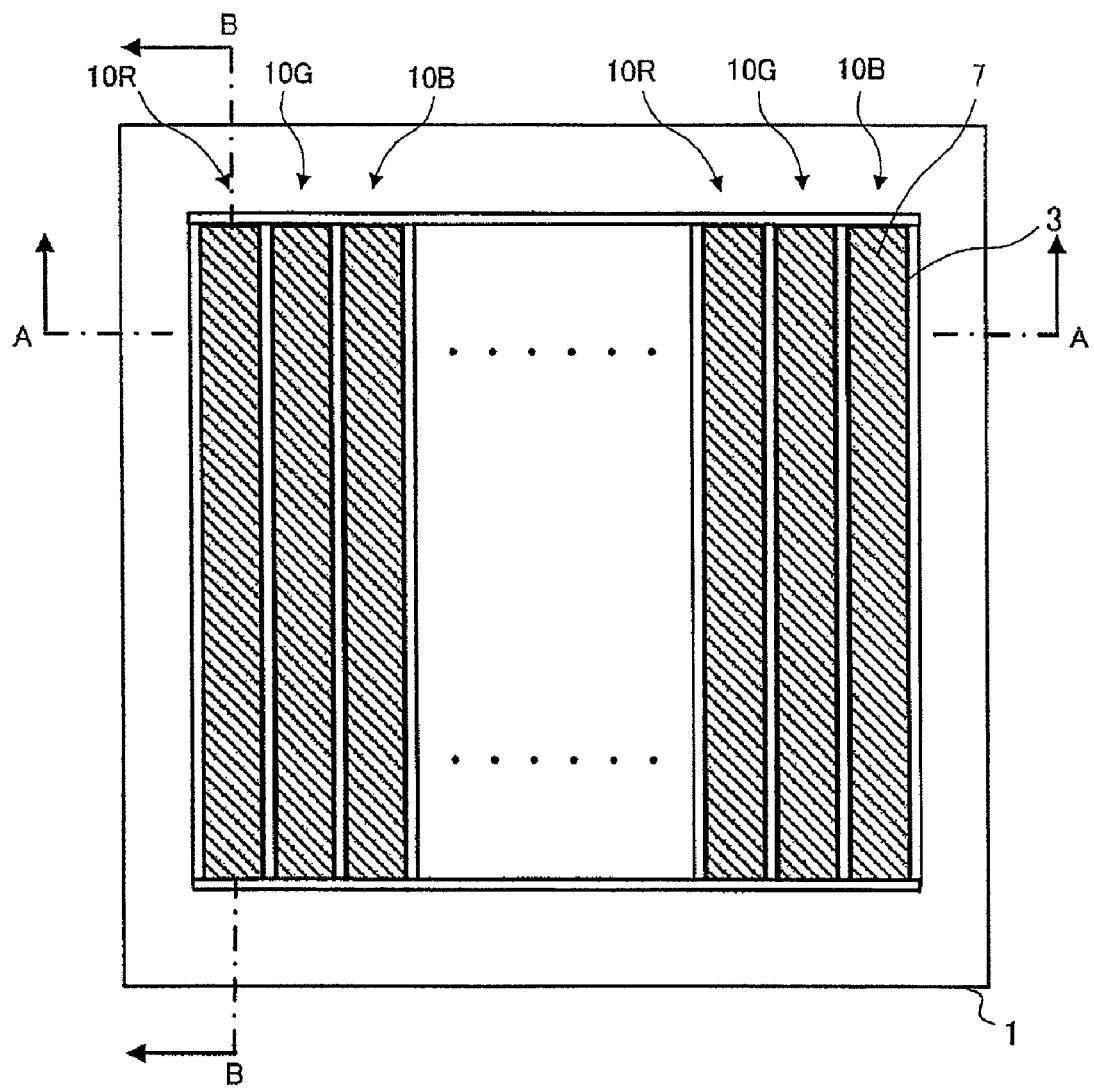
FIG. 5 is a plane view of an organic EL display panel of the present invention.

A plurality of the organic EL elements of the present invention may be arranged in matrix state on substrate 1 so as to constitute the organic EL display panel (See FIG. 5).

The organic EL display panel of the present invention has an organic EL element comprising a substrate, an anode electrode, a cathode electrode, and transport layer, an interlayer and a light emitting layer sandwiched by the both electrodes. In addition, the organic EL display panel of the present invention has a bank.

The organic EL display panel of the present invention has basic configuration in which a plurality of the above-mentioned organic EL elements are arranged in matrix state on the substrate, and the anode electrode, the bank, the hole transport layer, the interlayer, the organic EL layer, and the cathode electrode are characterized by having the following shapes.

Anode Electrode

When the organic EL display panel is of passive matrix type, a plurality of the anode electrodes are formed in lines. The line-state anode electrodes are preferably in parallel with each other. When the organic EL display panel is of active matrix type, a plurality of the anode electrodes are formed in matrix state (for each organic EL element) on the substrate.

Bank

A plurality of the banks are formed in lines on the substrate and define a line-state regions on the substrate (See FIG. 5). The line-state banks are preferably in parallel with each other. When the anode electrodes are in line state, the line direction of the line-state bank preferably crosses the line direction of the anode electrodes at a right angle.

In one line-state region defined by the line-state banks, a plurality of the organic EL elements lined up in one row are set. On the line-state region, a solution containing the material of the functional layer is sequentially applied. Hereinafter, the line-state region defined by the line-state banks is referred to as "application region".

Hole Transport Layer

In the organic EL display panel of the present invention, the hole transport layer is set for each organic EL element separately. That is, the hole transport layers are formed in matrix state (See FIG. 6). In addition, the hole transport layers are formed in the above-mentioned application region.

Interlayer

The interlayer is set as a single layer in an entire application region which includes plurality of organic EL elements. That is, the interlayer is formed in line in the application region.

Organic EL Layer

The organic EL layer is set as a single layer in an entire application region which includes the plurality of organic EL elements. That is, the organic EL layer is formed in line in the application region.

The organic EL material is selected as appropriate so that a desired color (red R, green G, blue B) is emitted from each application region. For example, a green pixel is arranged adjacent to a red pixel, a blue pixel is arranged adjacent to the green pixel, and a red pixel is arranged adjacent to the blue pixel (See FIG. 5).

Cathode Electrode

The cathode electrode is formed on the organic EL layer set in each application region and the cathode electrode is usually formed in line in each application region separately (See FIG. 5). Usually, in order to separate the cathode electrodes formed in the adjacent application regions, the line-state banks play roll as a cathode separator. The cathode electrode does not have to be separated for each application region in some cases. That is, when the anode electrodes are independently controlled for each pixel as in the active matrix type, the TFT elements for driving the pixel electrode are independent, and a plurality of application regions can share the single cathode electrode.

The organic EL display panel of the present invention may have an inorganic insulating film protruding from the bank into the application region.

When a material of the hole transport layer is PEDOT-PSS, the inorganic insulating film is set so as to be in contact with the bottom surface of the hole transport layer. On the other hand, when the material of the hole transport layer is a metal oxide such as tungsten oxide or the like, the inorganic insulating film is set so as to be in contact with the bottom surface of the interlayer.

The organic EL display panel of the present invention may have second banks defining a pixel region in the application region (See FIG. 7). Here, the pixel region means an opening in the single organic EL element. A height of the second bank from the substrate may be the same as the height of the line-state bank from the substrate, but it is preferably smaller than the height of the line-state bank from the substrate. The height of the second bank from the substrate is preferably 0.1 to 0.5 µm.

A material of the second bank is not particularly limited as long as it is insulating. A material of the second bank is preferably an insulating resin. Further, the material of the second bank may be fluorine-resin or non-fluorine-resin. Therefore, the material of the second bank may be a non-fluorine resin (non-fluorine polyimide resin, non-fluorine polyacrylic resin, or the like).

At the second banks defining the pixel region, grooves connecting the adjacent pixel regions with each other are provided (See FIG. 7). The width of the groove is preferably 10 to 30 µm, and more preferably 18 to 22 µm.

The setting position and function of the second bank are different depending on the materials of the hole transport layer. The setting position of the second bank is described below separately for the case where the material of the hole transport layer is PEDOT-PSS and for the case where it is a metal oxide such as tungsten oxide or the like.

(1) In the Case where the Material of the Hole Transport Layer is PEDOT-PSS

When the material of the hole transport layer is PEDOT-PSS, the second banks define the region of the hole transport layer. That is, when the material of the hole transport layer is PEDOT-PSS, the second bank has a function to prevent intrusion of the solution into the adjacent pixel region when the solution containing PEDOT-PSS is applied to the application region and to define the hole transport layers in matrix state.

(2) In the Case where the Material of the Hole Transport Layer is a Metal Oxide Such as Tungsten Oxide or the Like When the material of the hole transport layer is a metal oxide, the second banks define regions of the interlayer and the organic EL layer. In this case, the second bank has a function to increase the yield.

In a manufacturing process of the organic EL display of the present invention, dusts might adhere in the application region before the formation of the interlayer or the organic EL layer. As will be described later, the interlayer and the organic EL layer is formed by applying the material, and if the material of the interlayer or the organic EL layer is applied in the application region to which the dusts adhere, the applied material is attracted to the dusts and an uncovered area (the area not covered with the interlayer or the organic EL layer) is generated in the application region.

On the other hand, when the second banks defining a plurality of pixel regions are set in the application region, the second banks prevent the applied material of the interlayer or organic EL layer from being attracted to the dust. Therefore, even if the dusts adhere to the application region, an uncovered area is hardly generated in the application region. Consequently, the second banks defining the inter layer and the organic EL layer contribute to the increase of the yield.

In addition, electric cross talk between the pixels may be suppressed by the second banks. Further, by providing the groove connecting the pixel regions with each other at the second bank, the solution containing the material of the interlayer or the organic EL layer can move between the pixel regions, and the thickness of the interlayer or the organic EL layer to be formed is leveled in the application region.

3. A Manufacturing Method of Organic EL Display Panel

The organic EL display panel of the present invention may be manufactured by any method as long as the effect of the present invention is not impaired. For the organic EL display panel of the present invention, the manufacturing method is preferably changed according to the material of the hole transport layer.

A manufacturing method of the organic EL display panel is described below separately for the case where the hole transport layer is PEDOT-PSS and for the case where it is a metal oxide such as tungsten oxide or the like.

(1) In the Case where the Material of the Hole Transport Layer is PEDOT-PSS

When the hole transport layer is made of PEDOT-PSS, the manufacturing method of the organic EL display panel of the present invention preferably includes the steps of 1) forming an anode electrode on a substrate; 2) forming line-state banks containing a fluorine resin on the substrate so that the anode electrode is exposed to define a line-state region (application region); 3) forming matrix-state hole transport layers on the substrate; 4) forming a line-state interlayer in the application region; 5) forming a line-state organic EL layer in the application region; and 6) forming a cathode electrode on the organic EL layer.

This manufacturing method may further have a step of forming an inorganic insulating film between the 1) step and the 2) step. The inorganic insulating film is formed with plasma CVD method or sputtering method, for example.

In the 1) step, the anode electrode may be formed by forming a conducting thin film on a substrate and patterning it by photolithography or etching, and the method is not particularly limited.

In the 2) step, the line-state banks are formed using photolithography or printing technology.

Formation of the banks containing a fluorine resin using the photolithography technology includes the steps of a) forming a film of a photosensitive resin composition containing a fluorine resin on a substrate on which an anode electrode is formed, and b) exposing and developing the film so as to expose part or the whole of the anode electrode.

In order to form a film of the photosensitive resin composition containing the fluorine resin on the substrate surface on which the anode electrode is formed, for example a technique such as spin-coating, die-coating, slit-coating or the like can be used to form a film; and then the formed film is dried. The drying condition is not particularly limited, and the film may be left for 2 to 3 minutes at 80° C.

By exposing and developing the film of the photosensitive resin composition containing the fluorine resin, the line-state region (application region) is defined, and the anode electrode is exposed. The shape of the developed film is preferably the forward tapered shape as shown in FIGS. 1 and 2 as mentioned above. The shape of developed film is controlled by setting the conditions of exposure and development as appropriate.

The developed film is subjected to bake-treatment. By the bake-treatment, a fluorine component of the fluorine resin contained in the film is considered to be floated to the film surface. The condition of the bake-treatment approximately 200° C. or more and the time is approximately 1 hour, for example. By this treatment, a bank that has the desired lyophilicity is formed. As mentioned above, by making the shape of the bank the forward tapered shape, the lyophilicity of the bank is changed according to the height of the bank.

On the other hand, when a resin film containing the fluorine resin of a predetermined pattern is formed with the printing technology, a technique such as intaglio printing, letterpress printing or the like may be used.

In addition, in the example of this manufacturing method, the second banks may be formed in the 2) step. In this manufacturing method, the second banks define the hole transport layer. In addition, instead of the second banks, a water-repellent self assembly monolayer (SAM) may be formed. Examples of such self assembly monolayer material include a silane coupling agent and the like. The self assembly monolayers preferably define the pixel region similarly to the second banks. Further, the self assembly monolayer is preferably set on the inorganic insulating film. The pixel regions preferably connect with each other also in the case where the self assembly monolayer is formed.

After the banks are formed, the substrate and/or the anode electrode surface in the application region may be washed by ozone water. The washing procedure by the ozone water is not particularly limited, and concentration of the ozone water may be approximately 0.02 to 20 ppm. More specifically, in the washing procedure the ozone water is dripped onto the application region, and the substrate is spun (at approximately 10 rpm). After spinning for approximately 2 minutes, water is dripped while the substrate is still being spun and further, isopropyl alcohol or the like is dripped to wash the substrate and/or anode electrode.

By the washing with the ozone water, the bank components adhering to the substrate or the anode electrode surface are appropriately removed without damaging the baked bank surface. On the other hand, the lyophilicity was conventionally improved by irradiating the application region with ultraviolet rays or plasma (oxygen plasma, for example), but it has been known that the irradiation of the ultraviolet rays or plasma easily damages the surface of the baked bank, and the fluorine components of the fluorine resin localized on the surface are removed. Therefore, in the present invention, it is preferable that irradiation of the ultraviolet rays or plasma is not conducted.

As mentioned above, by washing with the ozone water, there are little bank components (that is, fluorine resin) remaining on the substrate or the anode electrode surface in the application region. The phrase "there are little bank components remaining on the substrate or the anode electrode surface" means that carbon atom concentration on the substrate or anode electrode surface in the application region is 20 atom % or less, preferably 15 atom % or less, and more preferably 12 atom % or less, for example. In addition, fluorine atom concentration on the substrate or anode electrode surface in the application region is preferably 5 atom % or less. The carbon atom concentration or fluorine atom concentration on the substrate or anode electrode surface may be measured by an X-ray photoelectron spectrometer (also referred to as XPS or ESCA) after removing the laminated functional layer so as to expose the substrate or the anode electrode surface.

In the 3) step, the matrix-state hole transport layers are formed by applying the solution containing PEDOT-PSS with the ink-jet, die-coating, letterpress printing or the like, for example. The hole transport layer is formed on the anode electrode. In the case where the second banks are formed, the matrix-state hole transport layers may be formed by applying the solution containing PEDOT-PSS to the pixel region defined by the second banks.

In the 4) step, the line-state interlayer is formed with ink-jet, die-coating, letterpress printing or the like in the application region.

In the 5) step, ink containing the organic EL material and a solvent is applied to the application region.

The application may be carried out using a technique such as ink-jet, dispenser, nozzle coating, intaglio printing, letterpress printing or the like. When ink is applied with the dispenser, ink discharge from the dispenser is preferably controlled by suck-back operation or the like at the beginning and the end of the linewise application. The thickness of the applied ink (thickness of the coat film) may be approximately 1 to 10 μm. Further, a layer containing the organic EL material is formed by drying the coat film.

In the 6) step, the cathode electrode is formed on the organic EL layer. The cathode electrode may be formed with a deposition method.

(2) In the Case where the Hole Transport Layer is a Metal Oxide Such as Tungsten Oxide or the Like When the hole transport layer is made of a metal oxide such as tungsten oxide or the like, the manufacturing method of the organic EL display panel of the present invention preferably includes the steps of 1) forming the anode electrode on the substrate; 2) forming the matrix-state hole transport layers on the substrate; 3) forming the line-state banks containing the fluorine resin on the substrate so that the hole transport layer is exposed to define the application region; 4) forming the line-state interlayer in the application region; 5) forming the organic EL layer in the application region; and 6) forming the cathode electrode on the organic EL layer.

This manufacturing method may have a step of forming an inorganic insulating film between the 2) step and the 3) step.

The step of forming the anode electrode on the substrate surface, the step of forming the line-state interlayer and organic EL layer, and the step of forming the cathode electrode in this manufacturing method are the same as those in the manufacturing method of the above (1), and they may be carried out by the same means.

In the 2) step, the matrix-state hole transport layers made of a metal oxide such as tungsten oxide or the like are formed on the substrate. The matrix-state hole transport layers may be formed by forming a layer made of a metal oxide such as tungsten oxide or the like on the substrate by a sputtering method or a heating deposition method and then, etching the layer in matrix state to pattern it in matrix state. The hole transport layer is formed on the anode electrode.

In the 3) step, the line-state banks containing the fluorine resin are formed on the substrate on which the anode electrode and the hole transport layer are formed so as to expose the hole transport layer. The forming method of the bank may be the same as the forming method of the bank in the manufacturing method of (1).

The second banks may be formed in the same step when the line-state banks containing a fluorine resin are formed or after the step when the line-state banks containing a fluorine resin are formed. In this manufacturing method, the second banks define the regions of the interlayer and the organic EL layer. Instead of the second banks, the self assembly monolayer may be formed.

Further, after the banks are formed, the exposed hole transport layer may be washed with ozone water. The washing method with the ozone water may be the same as the washing method with the ozone water in the manufacturing method of (1).

By the washing with the ozone water, there are little bank components (that is, fluorine resin) remaining on the substrate or the hole transport layer surface in the application region. The phrase "there are little bank components remaining on the substrate or the hole transport layer surface" means that carbon atom concentration on the substrate or hole transport layer surface in the application region is 20 atom % or less, preferably 15 atom % or less, and more preferably 12 atom % or less, for example. In addition, fluorine atom concentration on the substrate or hole transport layer surface in the application region is preferably 5 atom % or less. The carbon atom concentration or fluorine atom concentration on the substrate or hole transport layer surface may be measured by an X-ray photoelectron spectrometer (also referred to as XPS or ESCA) after removing the laminated functional layer so as to expose the substrate or the hole transport layer surface.

In the 4) step, the interlayer is formed in the line-state application region, and in the 5) step, the organic EL layer is formed in the line-state application region. The forming method of the interlayer and the organic EL layer may be the same as the forming method of the interlayer and the organic EL layer in the manufacturing method of (1).

In the case where the second banks are formed, the forming method of the interlayer and the organic EL layer includes a step of applying the solution containing the materials of the interlayer or the organic EL layer to the pixel region defined by the second banks.

4. Organic Semiconductor Element

The organic semiconductor element of the present invention has a substrate, a source electrode, a drain electrode, and an organic semiconductor layer.

The source electrode and the drain electrode may be set so as to form a gap between the source electrode and the drain electrode. A gap distance between the source electrode and the drain electrode is usually several The materials of the source electrode and the drain electrode are not particularly limited but are a conductive metal, a conductive polymer or the like. Examples of the conductive metal include molybdenum Mo, tungsten W, aluminum Al, chromium Cr, Titanium Ti, Gold Au, and an alloy of them. The source electrode and the drain electrode may be a multi-layered metal film of different kinds of metals.

The source electrode and the drain electrode on the substrate and a region connecting the both electrodes are covered by a semiconductor layer (channel) containing an organic semiconducting material. Examples of the organic semiconducting material include a low-molecular organic semiconducting material such as pentacene, tetracene, a phthalocyanine compound or the like; a polymeric organic semiconducting material such as polythiophene, polyphenylenevinylene or the like; carbon nanotubes; and others. The organic semiconductor element of the present invention preferably has a polymeric organic semiconducting material.

The semiconductor layer is preferably formed by applying a polymeric organic semiconducting material to a region defined by the banks.

The banks defining the semiconductor layer are characterized by containing a fluorine resin similar to the organic EL element. A material of the bank in the semiconductor element of the present invention may be the same as the material of the bank in the organic EL element. In addition, the lyophilicity of the bank gradually changes along the thickness direction of the bank. That is, the lyophilicity on the upper surface of the bank is preferably low, and the lyophilicity on the bottom surface of the bank is preferably high.

The lyophilicity gradient along the bank thickness direction is obtained by making the shape of the baked bank the forward tapered shape as mentioned above.

As a result, the ink containing the material of the semiconductor layer applied to the region defined by the banks is applied appropriately up to the edge of the bank, and the semiconductor layer having a uniform thickness is obtained. Thereby, channel characteristics of the semiconductor layer are improved.

After the banks are formed, the electrode and substrate exposed in the region defined by the banks may be washed with ozone water before the formation of the semiconductor layer. The washing method with the ozone water may be the same as the washing method with the ozone water in the manufacturing method of the organic EL display panel. By the washing with the ozone water, the semiconductor layer is formed on a cleaner electrode surface.

In the organic semiconductor of the present invention, a gate electrode controlling a channel, which channel is the organic semiconductor layer, is set. The gate electrode may be a back-gate electrode, a top-gate electrode or other types of gate electrodes. An organic semiconductor element may further comprise an overcoat layer for protecting the organic semiconductor layer.

Embodiment 1

In Embodiment 1, the organic EL element of the present invention will be described.

FIG. 2 shows an example of the organic EL element of the present invention. The organic EL element shown in FIG. 2 has substrate 1, anode electrode 2, bank 3, hole transport layer 4, interlayer 5, organic EL layer 6, and cathode electrode 7.

As mentioned above, in the case where the organic EL element is of bottom emission type, materials of substrate 1 and anode electrode 2 are preferably transparent; in the case where the organic EL element is of top emission type, the material of cathode electrode 7 is made transparent and the material of anode electrode 2 is preferably a material with high reflectivity.

A work function of a surface of anode electrode 2 in contact with hole transport layer 4 is preferably controlled to 5.1 to 5.5 eV in order to make it easier for holes to be injected. The work function of the metal anode electrode means the required minimum energy to take out a single electron from the electrode surface to the outside.

Hole transport layer 4, interlayer 5, and organic EL layer 6 are preferably made of a polymeric organic material. That is because all of the layers is preferably formed with an application method.

Bank 3 is characterized by containing a fluorine resin. A color of bank 3 is not particularly limited, and it may be black. By setting the bank with a color having high contrast to the light from the light emitting layer (black, for example), the brightness may be increased.

As in FIG. 2, bank 3 has the forward tapered shape, the lyophilicity on lower part of the bank is high, while the lyophilicity on upper part of the bank is low as mentioned above. Further, bank 3 has the forward tapered shape and has two inflection points. That is, a contact angle of bank 3 with anode electrode 2 is small. Therefore, particularly when hole transport layer 4 is manufactured by the application method, the ink containing the hole injection material is appropriately applied up to the edge of the bank, and a layer having a more uniform thickness may be obtained easily. Therefore, light is easily emitted from the entire surface of the light emitting layer, and aperture ratio is increased.

Embodiment 2

In Embodiment 2, the organic EL display panel of an active matrix type will be described. In this embodiment, a material of the hole transport layer is PEDOT-PSS.

FIG. 5 is a plan view of the organic EL display panel of the active matrix type. On the panel shown in FIG. 5, a plurality of banks 3 formed in lines are set. Banks 3 define application regions 10. Application regions 10 are classified into application region 10R emitting red light; application region 10G emitting green light; and application region 10B emitting blue light, and they are set in order. Application region 10 is covered by cathode electrode 7. Cathode electrode 7 is separated by banks 3 for each application region 10.

Bank 3 is characterized by containing a fluorine resin. A color of bank 3 is not particularly limited, and it may be black. By setting the bank with a color having high contrast to the light emission from the light emitting layer (black, for example), the brightness may be increased. Though not shown, the shape of the bank is preferably a forward tapered shape.

Figure 6:
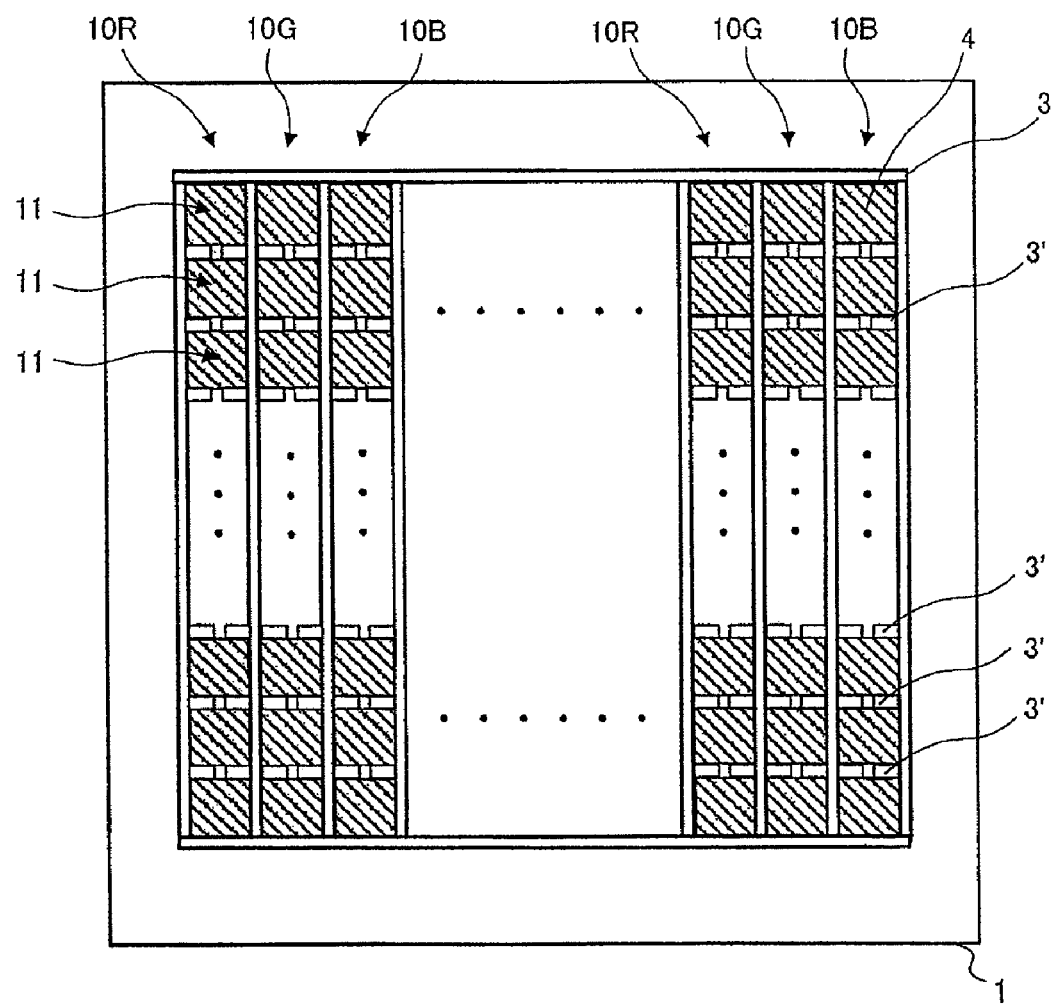
FIG. 6 is a plan view of the organic EL display panel of the present invention, from which a cathode electrode, an organic EL layer and an interlayer are removed.

FIG. 6 is a plan view of the organic EL display panel of the active matrix type in this embodiment, from which the cathode electrode, the organic EL layer, and the interlayer are removed. As shown in FIG. 6, in pixel region 11 defined by second banks 3', hole transport layer 4 is set. As a result, hole transport layers 4 are arranged in matrix state on substrate 1. In addition, second bank 3' has a groove connecting pixel regions 11 with each other.

Figure 7A:
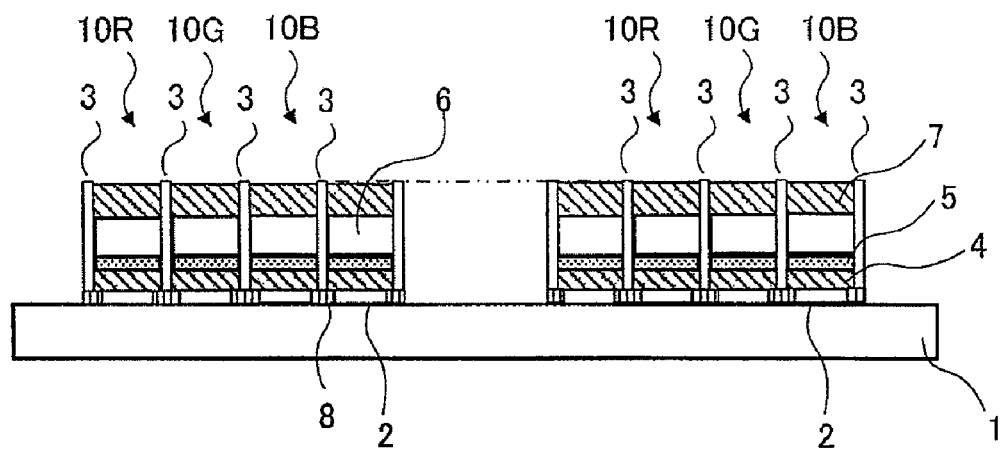
FIG. 7A is a sectional view of the organic EL display panel of the present invention.
Figure 7B:
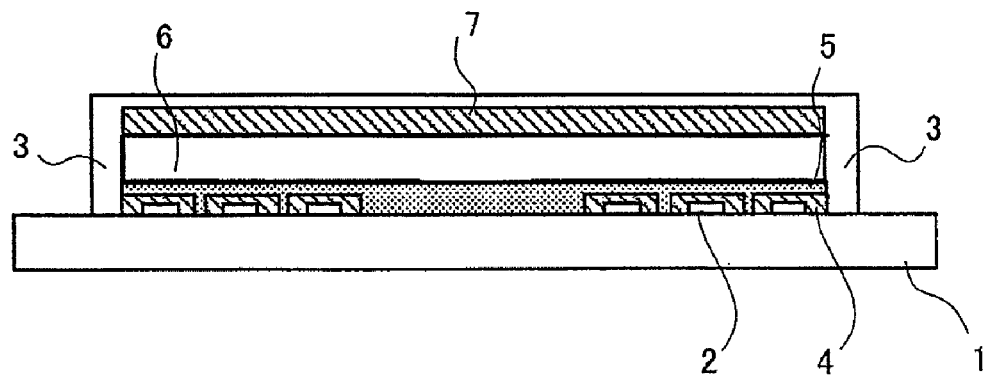
FIG. 7B is a sectional view of the organic EL display panel of the present invention.

FIG. 7A shows a sectional view taken along line A-A of the organic EL display panel of this embodiment shown in FIG. 5. FIG. 7B shows a sectional view taken along line B-B of the organic EL display panel of this embodiment shown in FIG. 5.

As shown in FIG. 7A, inorganic insulating film 8 is set so as to be in contact with the bottom surface of hole transport layer 4. By inorganic insulating film 8, when hole transport layer 4 is formed by applying PEDOT-PSS to pixel region 11, the film thickness of hole transport layer 4 is made more uniform.

As shown in FIG. 7B, hole transport layer 4 is separately set on each anode electrode 2 so as to cover anode electrode 2. On the other hand, interlayer 5 and organic EL layer 6 are set over the plurality of organic EL elements in application region 10.

Embodiment 3

In Embodiment 2, the organic EL display panel in which the material of the hole transport layer is PEDOT-PSS was described. In Embodiment 3, the organic EL display panel in which the material of the hole transport layer is a metal oxide such as tungsten oxide or the like will be described.

A plan view of the organic EL display panel of this embodiment is the same as the plan view of the organic EL display panel of Embodiment 2. Therefore, FIG. 5 is also the plan view of this embodiment.

Figure 8A:
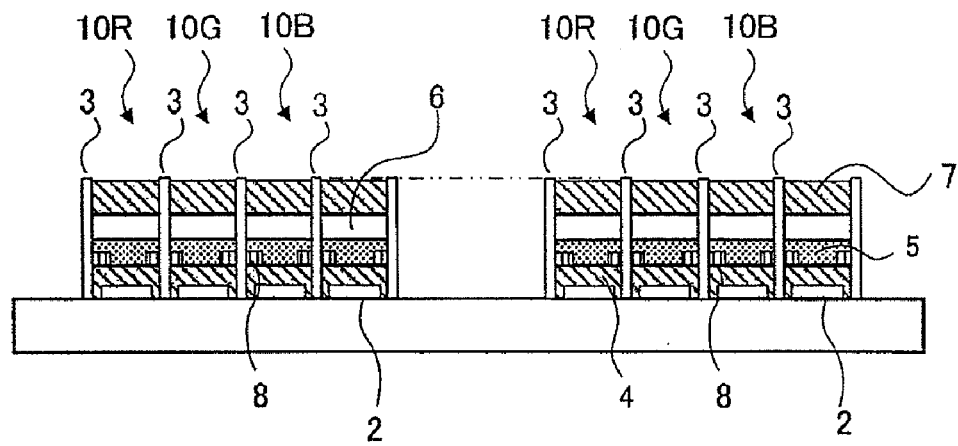
FIG. 8A is a sectional view of the organic EL display panel of the present invention.
Figure 8B:
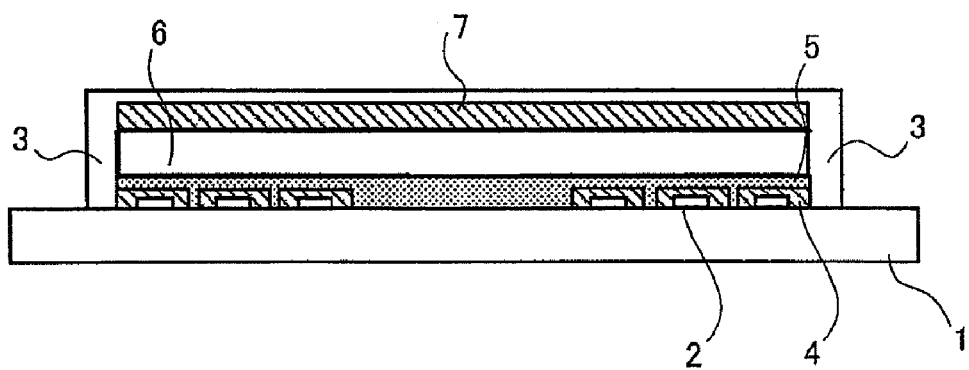
FIG. 8B is a sectional view of the organic EL display panel of the present invention.

FIG. 8A shows a sectional view taken along line A-A of the organic EL display panel of this embodiment shown in FIG. 5. FIG. 8B shows a sectional view taken along line B-B of the organic EL display panel of this embodiment shown in FIG. 5.

As shown in FIGS. 8A and 8B, the organic EL display panel of this embodiment is the same as the organic EL display panel of Embodiment 2 except for the setting position of inorganic insulating film 8. Therefore, the same reference numerals are given to the same members as those in the organic EL display panel of Embodiment 2, and the description will be omitted.

As shown in FIG. 8A, in the organic EL display panel of this embodiment, inorganic insulating film 8 is set so as to be in contact with the bottom surface of interlayer 5. In this embodiment, since the material of the hole transport layer is a metal oxide such as tungsten oxide or the like so that the hole transport layer is not formed with the application method. Therefore, in this embodiment, inorganic insulating film 8 plays a role to make the film thickness of interlayer 5 formed with the application method uniform.

Embodiment 4

In Embodiment 4, the organic semiconductor element will be described.

Figure 9:
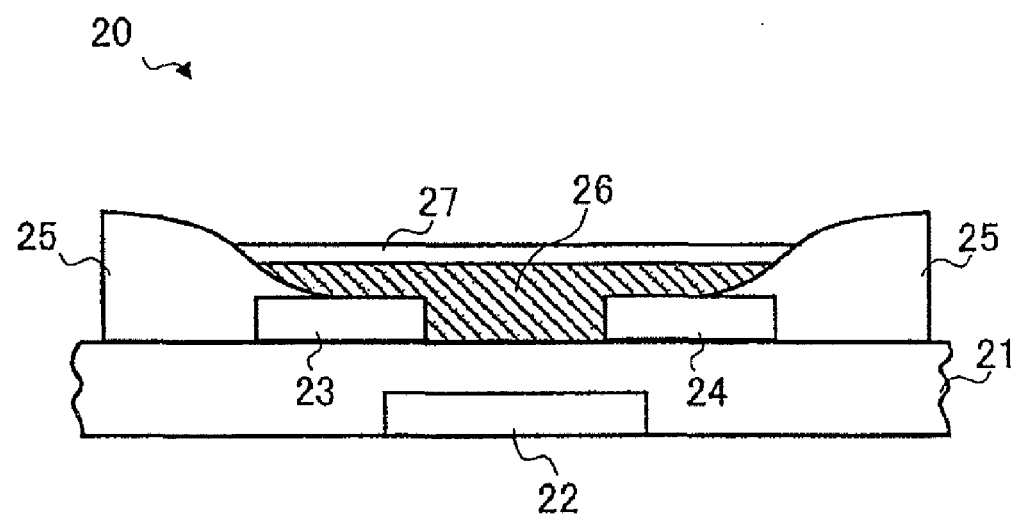
FIG. 9 is a diagram illustrating an organic semiconductor element of the present invention.

FIG. 9 illustrates an example of the organic semiconductor element of the present invention. The organic semiconductor element shown in FIG. 9 is a so-called "back-gate type" thin film transistor and has substrate 21, back-gate electrode 22, source electrode 23, drain electrode 24, bank 25, organic semiconductor layer 26, and overcoat layer 27. It is needless to say that the organic semiconductor element of the present invention may be of top-gate type.

Bank 25 is characterized by containing a fluorine resin. Similar to FIG. 2, since bank 25 shown in FIG. 9 has the forward tapered shape, the lyophilicity on lower part of the bank is high and the lyophilicity on upper part of the bank is low. In addition, bank 25 has the forward tapered shape and has two inflection points. That is, the contact angle of bank 25 to source electrode 23 and drain electrode 24 is small.

Therefore, when organic semiconductor layer 26 is manufactured by the application method, the ink containing the organic semiconducting material may be appropriately applied up to the edge of the bank, a layer with more uniform thickness is easily obtained, and thinning of the film is also realized. Thus, the channel characteristics of organic semiconductor layer 26 are improved (including improvement of mobility and improvement of ON/OFF ratio).

The present application claims priority based on Japanese Patent Application No. 2007-145877 filed on May 31, 2007. The contents described in this description of the application are all incorporated herein by reference.

INDUSTRIAL APPLICABILITY

The organic EL element of the present invention has the function to make the organic functional layer exert appropriately. That is, the thickness of the functional layer is made constant and functional deterioration due to impurities such as the bank components or the like is suppressed. The organic device of the present invention is used as the organic semiconductor element or the organic EL element or the like, for example.

EXPLANATION OF REFERENCE NUMERALS

| 1 | SUBSTRATE |
|---|---|
| 2 | ANODE ELECTRODE |
| 3 | BANK |
| 3' | SECOND BANK |
| 4 | HOLE TRANSPORT LAYER |
| 5 | INTERLAYER |
| 6 | ORGANIC EL LAYER |
| 7 | CATHODE ELECTRODE |
| 8 | inorganic insulating film |
| 10 | application region |
| 11 | pixel region |
| 20 | ORGANIC SEMICONDUCTOR ELEMENT |
| 21 | SUBSTRATE |
| 22 | GATE ELECTRODE |
| 23 | SOURCE ELECTRODE |
| 24 | DRAIN ELECTRODE |
| 25 | BANK |
| 26 | ORGANIC SEMICONDUCTOR LAYER |
| 27 | overcoat LAYER |

What is claimed is:

1. A top emission type organic EL display panel comprising:
   a substrate;
   anode electrodes set on the substrate;
   hole transport layers set on the anode electrodes, the hole transport layers containing tungsten oxide, molybdenum oxide, vanadium oxide, or a combination thereof;
   organic EL layers set on the hole transport layers;
   transparent cathode electrodes set on the organic EL layers; and
   a plurality of linear banks having a forward tapered shape, which define the organic EL layers; wherein:
      the plurality of linear banks contain a fluorine resin,
      a fluorine concentration at a top of the plurality of linear banks is higher than a fluorine concentration at a bottom surface of the plurality of linear banks, and
      a height of the top of the plurality of linear banks from the substrate is 0.8 to 1.2 µm.

2. The top emission type organic EL display panel according to claim 1, wherein the fluorine concentration at the top of the plurality of linear banks is 5 to 10 atom % and the fluorine concentration at the bottom surface of the plurality of linear banks is 0 to 3 atom %.

3. The top emission type organic EL display panel according to claim 1, further comprising thin film transistors each including a source electrode or a drain electrode, wherein:
   the anode electrodes are connected with respective thin film transistors at the source electrode or the drain electrode.

* * * * *